(12) United States Patent
Osborne

(10) Patent No.: US 7,167,946 B2
(45) Date of Patent: *Jan. 23, 2007

(54) METHOD AND APPARATUS FOR IMPLICIT DRAM PRECHARGE

(75) Inventor: Randy B. Osborne, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 256 days.

This patent is subject to a terminal disclaimer.

(21) Appl. No.: 10/676,882

(22) Filed: Sep. 30, 2003

(65) Prior Publication Data

US 2005/0071541 A1 Mar. 31, 2005

(51) Int. Cl.
*G06F 12/00* (2006.01)

(52) U.S. Cl. ....................................... 711/105
(58) Field of Classification Search .................. 711/5, 711/105, 154, 158, 167, 170, 111; 365/203, 365/230
See application file for complete search history.

(56) References Cited

U.S. PATENT DOCUMENTS

| 5,301,278 | A | * | 4/1994 | Bowater et al. ............... 711/5 |
| 5,463,590 | A | * | 10/1995 | Watanabe .............. 365/230.03 |
| 5,539,696 | A | * | 7/1996 | Patel .................... 365/189.01 |
| 5,544,306 | A | * | 8/1996 | Deering et al. ............. 345/545 |
| 5,636,173 | A | * | 6/1997 | Schaefer ..................... 365/203 |
| 5,715,203 | A | * | 2/1998 | Uchida ........................ 365/203 |
| 5,960,459 | A | * | 9/1999 | Thome et al. ............... 711/154 |
| RE36,532 | E | * | 1/2000 | Kim ............................. 365/203 |
| 6,145,065 | A | * | 11/2000 | Takahashi et al. ........... 711/158 |
| 6,182,192 | B1 | * | 1/2001 | Rovati ......................... 711/111 |
| 6,201,745 | B1 | | 3/2001 | Ryu et al. |
| 6,330,636 | B1 | * | 12/2001 | Bondurant et al. .......... 711/105 |
| 6,453,401 | B1 | * | 9/2002 | Barth et al. .................. 711/167 |
| 6,470,433 | B1 | * | 10/2002 | Prouty et al. ................ 711/168 |
| 6,505,282 | B1 | * | 1/2003 | Langendorf et al. ........ 711/170 |
| 6,532,526 | B2 | * | 3/2003 | Nizar et al. .................. 711/170 |
| 6,535,966 | B1 | | 3/2003 | Cherabuddi et al. |
| 6,539,440 | B1 | | 3/2003 | Stracovsky et al. |
| 2002/0031040 | A1 | | 3/2002 | Arimoto et al. |

FOREIGN PATENT DOCUMENTS

EP          1 026 595 A1    8/2000

OTHER PUBLICATIONS

"NEC Preliminary User's Manual, Memory Controller NA85E535 NBA85E535Vxx" Aug. 2002 Japan, Oct. 2002 English, pp. 16-27, 58-68, 80-90. 102-103, 119-132, 174-182.*

* cited by examiner

*Primary Examiner*—Pierre Bataille
*Assistant Examiner*—Paul Schlie
(74) *Attorney, Agent, or Firm*—Blakely, Sokoloff, Taylor & Zafman LLP

(57) ABSTRACT

Apparatus and method to implicitly transmit a command to close a row of memory cells within a memory device as part of the transmission of an activate command to open another row of memory cells within the memory device.

17 Claims, 6 Drawing Sheets

METHOD AND APPARATUS FOR IMPLICIT DRAM PRECHARGE

BACKGROUND

Dynamic random access memory (DRAM) devices provide the benefits of higher storage densities and less power consumption in comparison to other memory technologies, including and most notably, static random access memory (SRAM) devices. However, these benefits come at the cost of incurring various required delays before and/or after each access for reading, writing and other functions to allow the memory cells and other components within DRAM devices to be prepared for a subsequent access. Examples of such delays are row precharges, refresh operations, row activation, etc. Attempts at efficiently managing these myriad delays has resulted in the creation of commands to allow the times at which these various delays are incurred to be more precisely controlled, but this creates the additional overhead of additional commands needing to be transmitted between reading and writing accesses.

It has also become common practice to attempt to reduce both costs and the physical size of DRAM devices by multiplexing multiple functions onto the various signal input and outputs. However, this multiplexing requires multiple phases to transmit commands and/or addresses, effectively replacing physical separation of signals with temporal separation in which more time is required to allow various signal inputs and outputs to first serve one function and then serve at least a second, if not more functions. One example of multiplexing that brings about such a cost in time arises from the separation of addresses transmitted to DRAM devices into at least two parts (usually at least a row and a column address) that are then multiplexed onto the same input signals such that a first part of the address must be sent during one distinct time period, followed by at least a second part of the address being sent during at least one more distinct time period. This temporal separation into distinct phases increases, yet again, the overhead for the myriad commands required.

As DRAM devices have become progressively faster as a result of advances in the design of both the DRAM cells making up a DRAM device and in the transistors, etc., used to make up the DRAM cells, the speed at which the interfaces made up of the multiplexed input and output signals of DRAM devices operate have needed to increase. In an effort to achieve higher interface speeds while maintaining integrity in the transmission of commands, addresses and data, it has become common practice to synchronize the various phases and functions performed by multiplexed inputs and outputs to a clock signal to ensure that the states of the various inputs and outputs are transmitted and latched at appropriate times. Initially, whole clock cycles were commonly used as the timing basis for events on a memory bus. However, even speedier DRAM devices have resulted in the more recent adoption of half clock cycles as the timing basis for events on a memory bus, resulting in what has been referred to as "double-clocking" of signals, or what is more commonly referred to in reference to common SDRAM (synchronous DRAM) devices as "DDR" or "double data rate" devices. Although the increased speeds of interfaces would seem to provide an opportunity to fully accommodate the overhead of the many required commands, difficulties have been encountered at such higher interface speeds in meeting the more stringent signal setup and hold timing requirements in the transmission of each of the various phases required in the transmission of each of the myriad commands and/or addresses. These difficulties have been such that it has been proposed that commands and/or addresses be transmitted at only up to half the clock rate at which data is transferred in what has been called "2n clocking," thus denying the benefits of double-clocking to the transmission of commands and/or addresses.

The cumulative time penalties resulting from these various difficulties in transmitting commands and/or addresses have started to become significant to an extent rivaling the time lost to preparing the DRAM cells for being accessed. Indeed, there is growing concern that the overhead required for transferring addresses and/or commands may take up more of the available bandwidth of a memory bus than is required for the actual transferring of data.

BRIEF DESCRIPTION OF THE DRAWINGS

The objects, features, and advantages of the present invention will be apparent to one skilled in the art in view of the following detailed description in which.

DETAILED DESCRIPTION

In the following description, for purposes of explanation, numerous details are set forth in order to provide a thorough understanding of the present invention. However, it will be apparent to one skilled in the art that these specific details are not required in order to practice the present invention.

Embodiments of the present invention concern incorporating support for the implicit communication of a precharge operation on an open row in a bank of memory cells within a memory device in a manner that reduces number of commands required and hence reduces the bandwidth required for transmitting commands to initiate such precharge operations. Although the following discussion centers on DRAM devices in which memory cells are organized into one or more two dimensional arrays of rows and columns, it will be understood by those skilled in the art that the invention as hereinafter claimed may be practiced in support of any type of memory device having memory cells organized in any of a number of ways, including interleaved banks, arrays of more than two dimensions (i.e., more than two-part addresses), content-addressable, etc. Also, although at least part of the following discussion centers on memory devices within computer systems, it will be understood by those skilled in the art that the invention as hereinafter claimed may be practiced in connection with other electronic devices having memory devices.

Figure 1:
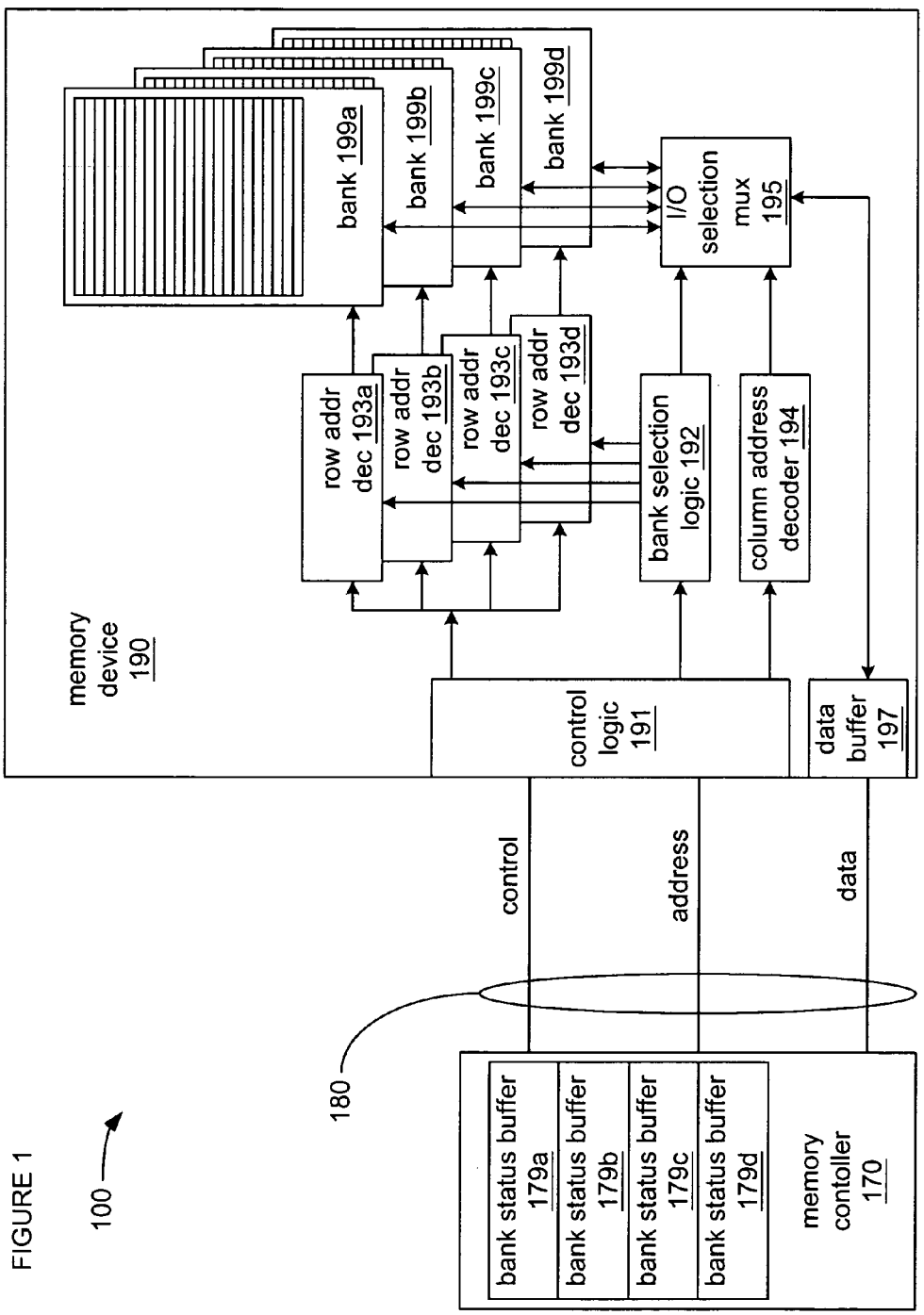
FIG. 1 is a block diagram of an embodiment employing a memory system.

FIG. 1 is a simplified block diagram of one embodiment employing a memory system. Memory system 100 is, at least in part, made up of memory controller 170 and memory device 190 coupled together via memory bus 180. Those skilled in the art of the design of memory systems will readily recognize that FIG. 1 depicts one form of a relatively simple memory system, and that alternate embodiments are possible in which the exact arrangement and configuration of components may be reduced, augmented or otherwise altered without departing from the spirit and scope of the present invention as hereinafter claimed. For example, although memory system 100 is depicted as having only one memory bus 180 and only one memory device 190 for the sake of simplicity in the discussion that follows, it will be readily understood by those skilled in the art that other possible embodiments of memory system 100 may be made up of multiple memory buses and/or devices.

Memory controller 170 controls the functions carried out by memory device 190 as part of providing access to memory device 190 to external devices (not shown) coupled to memory controller 170. Specifically, an external device coupled to memory controller 170 issues commands to memory controller 170 to store data within memory device 190, and to retrieve stored data from memory device 190. Memory controller 170 receives these commands and relays them to memory device 190 in a format having timing and protocols compatible with memory bus 180 and/or the combination of control logic 191 and data buffer 197 that make up the interface between memory device 190 and memory bus 180. In effect, memory controller 170 coordinates accesses made to memory cells within memory device 190 in answer to read and write commands from external devices. In support of these functions in various embodiments, memory controller 170 also coordinates various maintenance operations that must be performed to ensure that data stored within memory device 190 is preserved, including the initiation of regular refresh operations and the occurrence of precharge operations as needed between accesses.

Memory bus 180 is made up of various control, address and data signal lines coupling together memory controller 170 and memory device 190. The exact quantity and characteristics of the various signal lines making up various possible embodiments of memory bus 180 may be configured to be interoperable with any of a number of possible memory interfaces, including those meant to be compatible with known types of memory devices, among them being DRAM (dynamic random access memory) devices such as FPM (fast page mode) memory devices, EDO (extended data out), dual-port VRAM (video random access memory), window RAM, SDR (single data rate), DDR (double data rate), RAMBUS# DRAM, etc. In some embodiments, where activity on various signal lines is meant to be coordinated with a clock signal, one or more of the signal lines, perhaps the control signal lines, serves to transmit a clock signal between memory controller 170 and memory device 190. In some embodiments, one or more control signals and address signals may be multiplexed onto common signal lines such that control signals and address signals are transmitted at different times on common conductors for carrying signals between memory controller 170 and memory device 190. Also, in some embodiments, one or more address signals and data signals may be multiplexed onto common signal lines.

Memory device 190 is a DRAM memory device with an interface made up of control logic 191 and data buffer 197 configured to be interoperable with memory bus. In some embodiments, memory device 190 is a single integrated circuit/ In other embodiments, memory device 190 is made up of multiple integrated circuits of a removable memory module, such as a SIMM (single inline memory module), SIPP (single inline pin package), DIMM (dual inline memory module), etc. It is contemplated that memory device 190 may provide an indication that is readable by another device via memory bus 180 to which memory device 190 is coupled of the ability of the control logic 191 of the memory device 190 to both open a specific row and close a different row in response to receipt of a row activate command to open a specific row.

The memory cells of memory device 190 are grouped into multiple banks, such as banks 199a–199d, with each bank being organized into a two dimensional array of memory cells having rows and columns. In some embodiments, control logic 191 receives at least some commands and addresses from memory controller 170 through memory bus 180, and carries out those commands using row address decoders 193a–193d, column address decoder 194 and/or bank selection logic 192 to access one or more specific portions of one or more of banks 199a–199d. In essence, to gain access to a memory cell within memory device 190, the address of that memory cell is made up of three parts that are transmitted by memory controller 170 to memory device 190 over memory bus 180, namely the bank, row and column of the given memory cell. In response to at least read and write commands received from memory controller 170, I/O selection multiplexer 195 and data buffer 197 are used to store data into or retrieve data from one or more memory cells.

In some embodiments, memory controller 170 maintains bank status buffers 179a–179d, corresponding to banks 199a–199d of memory device 190, in which information concerning whether or not a row of the corresponding bank is open, or not, and the row address of that row. Memory controller 170 relies on the contents of bank status buffers 179a–179d to determine whether or not a need exists to transmit a row activate command to prepare a given row within a given bank for being accessed, and whether or not a different row within the same bank is already open such that additional time may be required for that different row to be closed with a precharge operation prior to the given row being opened in response to the activate command.

More specifically, in some embodiments, if memory controller 170 will be accessing a given row within a given bank, then memory controller 170 checks the contents of whichever one of bank status buffers 179a–179d corresponds to the given bank to determine whether the given row is already open, and if the given row is not, then to determine whether or not a different row is open. By way of example, if memory controller 170 is to access a given row within bank 199a, then memory controller 170 checks the contents of bank status buffer 179a to determine whether or not the given row is already open. If the given row is already open, then the transmission of a row activation command to open the given row is unnecessary. However, if the given row is not already open, then memory controller 170 checks the contents of bank status buffer 179a to determine whether or not a different row within bank 199a is open. If no rows within bank 199a are open (what is sometimes called a "page empty" condition), then memory controller 170 must transmit a row activation command to memory device 190 to open the given row within bank 199a in preparation for being accessed, and memory controller 170 must allow sufficient time between the transmission of the activation command and carrying out an access to the given row for the preparation of the given row for being accessed to take place. Alternatively, if the given row is not already open, but a different row is open (what is sometimes called a "page miss" condition), then memory controller 170 must transmit a row activation command (with an implied precharge command) to memory device 190 to both close the different row and to open the given row within bank 199a in preparation for being accessed, and memory controller 170 must allow sufficient time between the transmission of the activation command and carrying out an access to the given row both for the closing of the different row via a precharge operation and for the preparation of the given row for being accessed to take place.

Figure 2A:
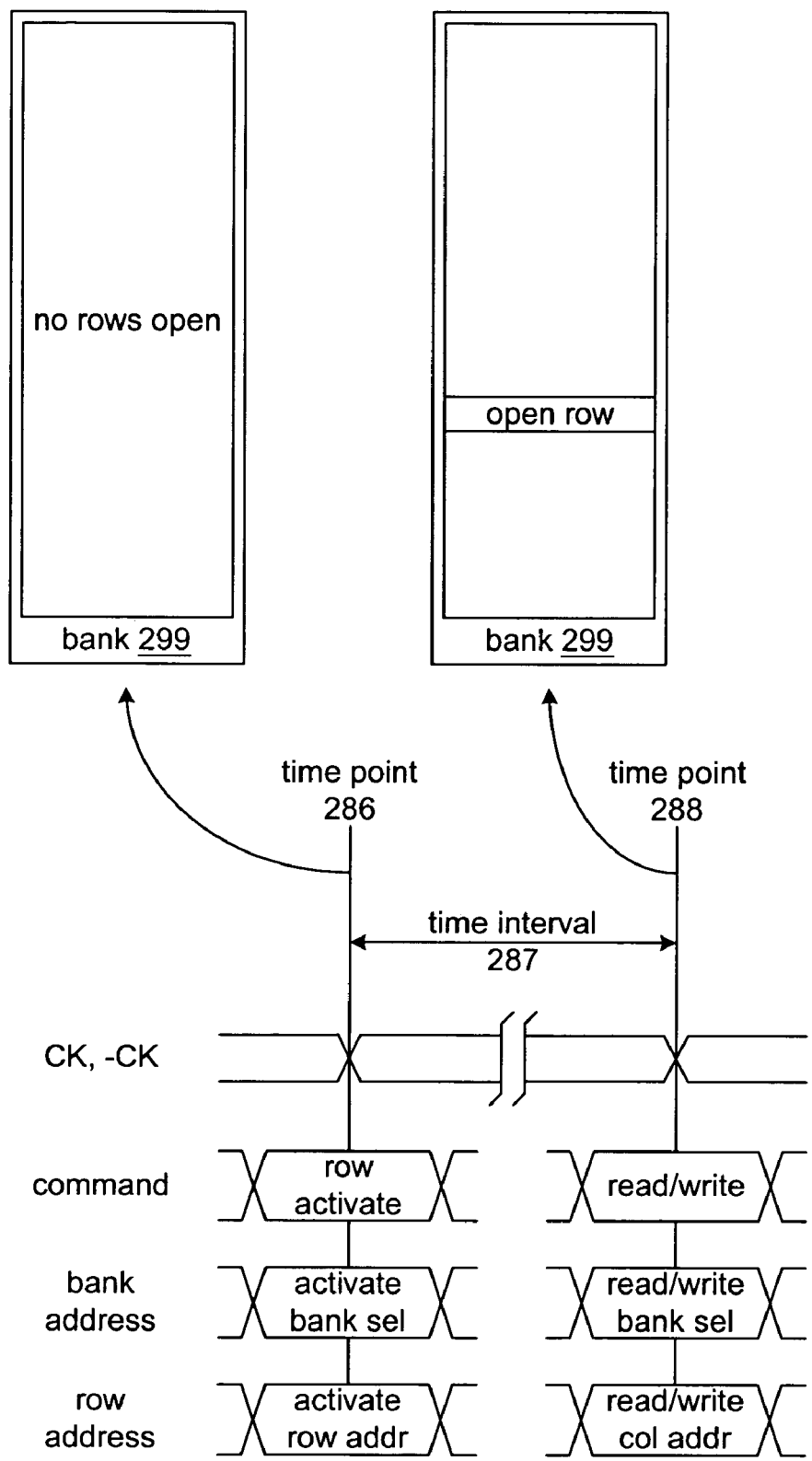
FIGS. 2*a* and 2*b* are timing diagrams and diagrams of effects of corresponding events for embodiments employing a memory bus.
Figure 2B:
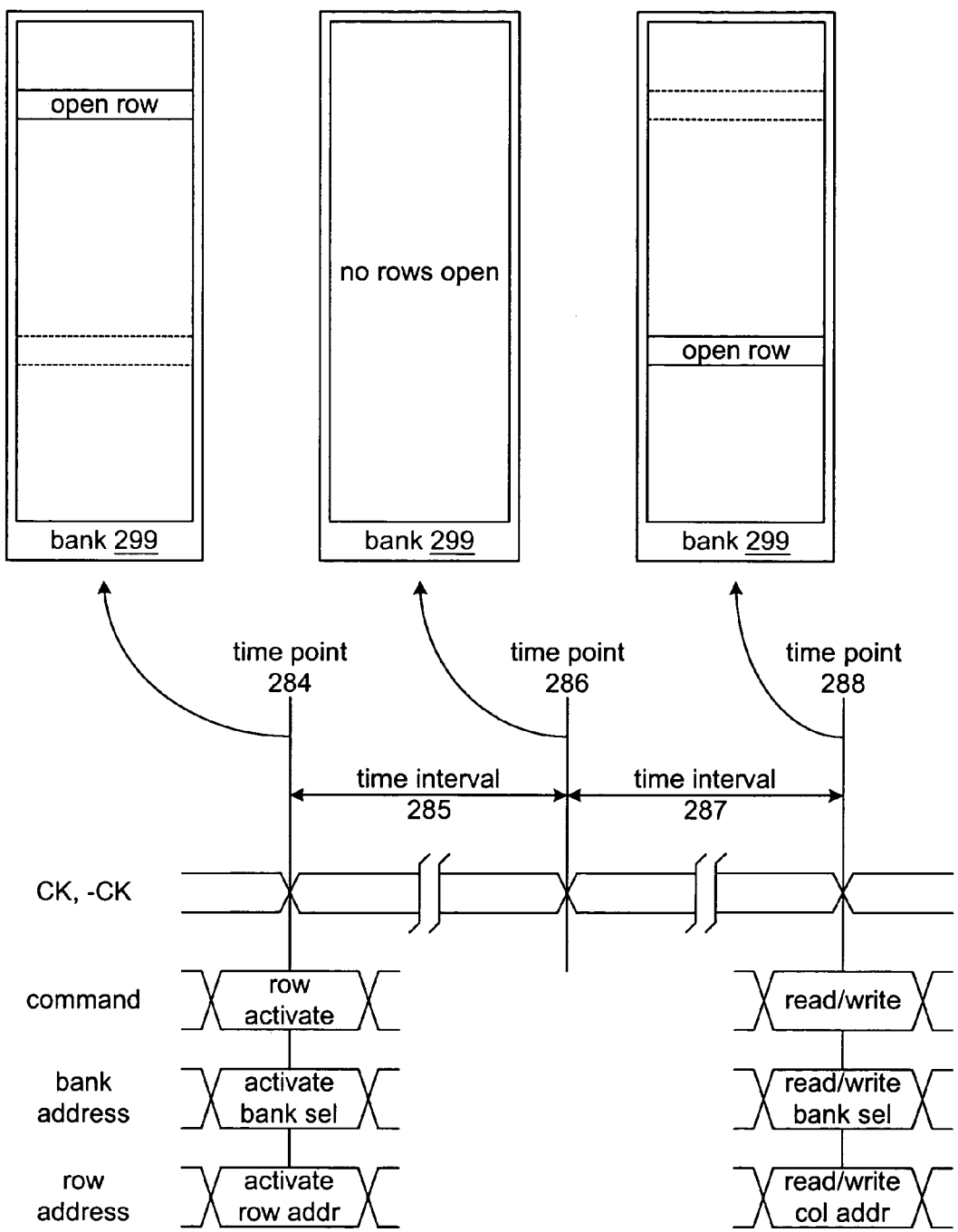

FIGS. 2a and 2b are timing diagrams and diagrams of corresponding effects of embodiments employing the transmission of signals across a memory bus. Both FIGS. 2a–b depict the transmission of an activate command to activate a row of memory cells within bank 299 of memory, namely bank 299, followed by the transmission of a read or write command to access a memory location within the opened row to retrieve or store a piece of data. Both FIGS. 2a and 2b depict the use of signals and timings compatible with known synchronous DRAM interfaces, in support of an example memory device having multiple banks of memory, of which bank 299 is only one. Although these figures and the accompanying discussion center on embodiments of memory buses on which transactions take place that are synchronized to a clock signal, it will be readily understood by those skilled in the art that other embodiments may employ other forms of timing coordination or may be asynchronous.

In FIG. 2a, no rows of memory cells are open within bank 299 at time point 286 when a row activate command is transmitted to open a row to be accessed within bank 299. Coincident with the transmission of the activate command may also be the transmission of the bank and/or row addresses to which the activate command applies, with the bank in this case being bank 299. A minimum predetermined number of clock cycles occurs during time interval 287 to allow sufficient time for the process of opening the row to be accessed to complete. As those skilled in the art will recognize, other commands, addresses and/or data may be transmitted during time interval 287, with the transmission of those commands, addresses and/or data perhaps involving other banks and/or memory devices. It will also be apparent to those skilled in the art that time interval 287 may be longer than simply the amount of time required for the opening of the row to be accessed to accommodate other aspects of memory control unrelated to the opening of the row to be accessed. At time point 288, the actual accessing of the row to be accessed is initiated with the transmission of a read or write command. Coincident with this transmission of a read or write command may also be the transmission of the bank and/or column address to which the read or write command applies.

In FIG. 2b, a different row of memory cells other than a row that is to be, accessed is already open within bank 299 at time point 286 when a row activate command is transmitted to open a row to be accessed within bank 299. As in FIG. 2a, coincident with the transmission of the activate command may also be the transmission of the bank and/or row addresses to which the activate command applies, with the bank again being bank 299. Again, a minimum predetermined number of clock cycles occurs during time interval 287 during which various unrelated commands, addresses and/or data may be transmitted. However, unlike what is depicted in FIG. 2a, the predetermined number of clock cycles is meant to provide sufficient time for the completion of both an implied process of precharging (i.e., closing) the different row that was already open at time point 286, as well as the process of the commanded row activation to open the row to be accessed. The minimum number of clock cycles required during time interval 287 for both processes to be completed in FIG. 2b is, therefore, longer than for time interval 287 in FIG. 2a. At time point 288, the actual accessing of the row to be accessed is initiated with the transmission of a read or write command, along with what may be the coincident transmission of the bank and/or column address to which the read or write command applies.

Regarding the length of time interval 287 in both FIGS. 2a and 2b, a device transmitting the row activate command at time point 286 and/or the read/write command at time point 288 may, in some embodiments, employ some form of buffer, register set and/or other storage device to maintain current information regarding whether or not a row is open in bank 299, and if so, the address of that row. Such information could be used to determine whether or not a given row activate command is to be interpreted as having an implied precharge command. In making such a determination, such information could be used to determine the minimum length of time. interval 287 required to ensure that both row activate operations occurring without a precharge operation and row activate operations accompanied by an implied precharge operations are provided with enough time to be completed. In some embodiments, the length of time interval 287 may be measured and/or apportioned by a number of clock transitions or full clock cycles as described with reference to both FIGS. 2a and 2b. Alternatively, in other embodiments that may include the use of asynchronous timing, the length of time interval 287 may be measured and/or apportioned in other ways. Also, despite the specific mention of the transmission of bank, row and column addresses coincident with the transmission of specific commands in embodiments depicted in FIGS. 2a and 2b, those skilled in the art will readily recognize that any combination of signals, addresses and/or commands may be transmitted coincident with the transmission of a row activate and/or read/write commands, either to provide interoperability with existing DDR specifications, or for other reasons without departing from the spirit and scope of the present invention as hereinafter claimed.

Figure 3:
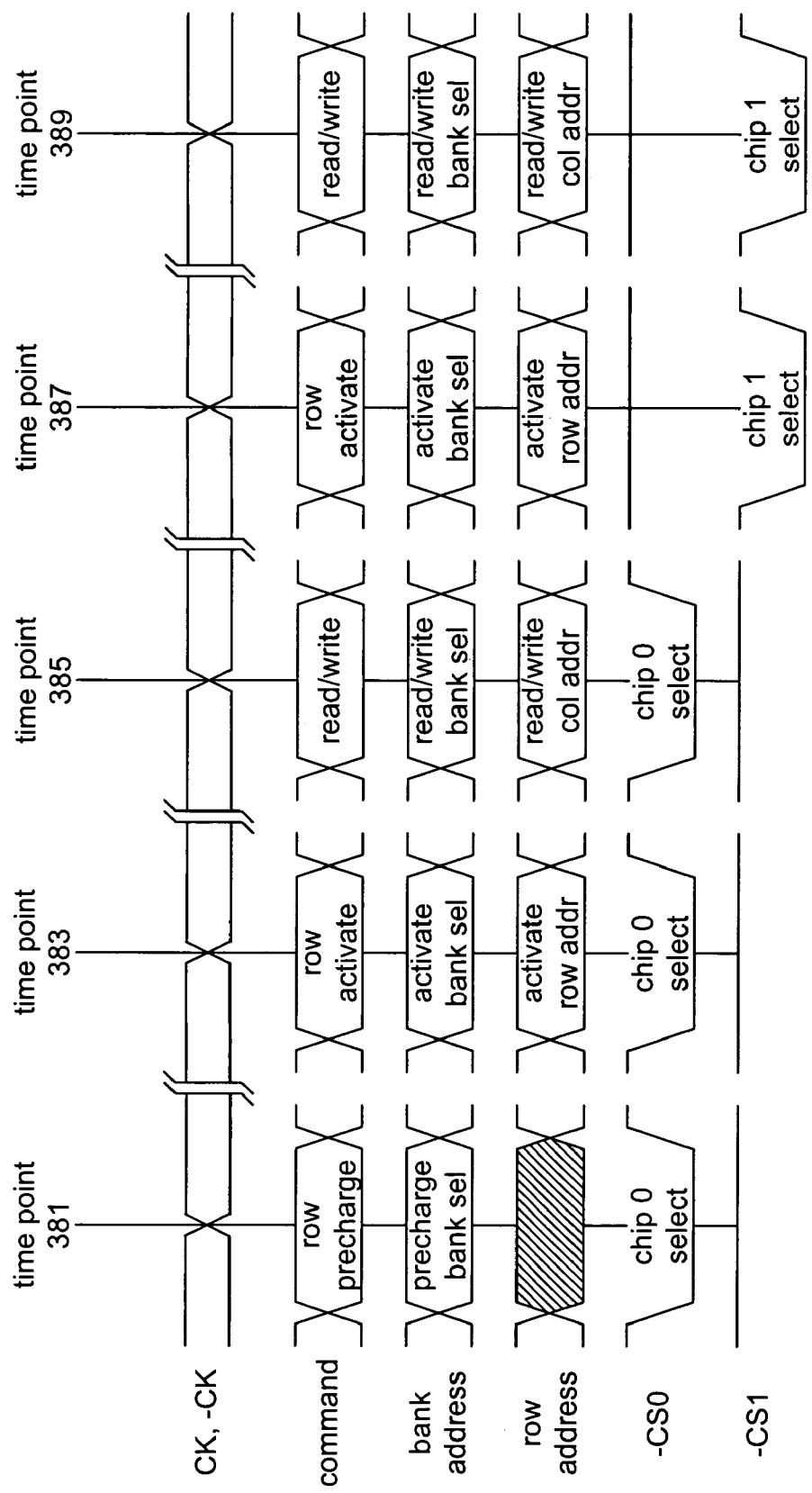
FIG. 3 is a timing diagram of an embodiment employing a memory bus.

FIG. 3 is a timing diagram of embodiments employing the transmission of signals across a memory bus to multiple memory devices, depicting the transmission of row activate and read/write commands to two memory devices. One memory device is selected by driving chip select line-CS0 to a low state as part of receiving/transmitting addresses, commands and/or data from/to that memory device, and the other memory device is selected by similarly driving chip select line-CS1 to a low state. Both memory devices are depicted as receiving commands appropriate for opening a row to be accessed with a row activate command after first causing a different row that is already open to be closed. Again, although this figure and the accompanying discussion center on embodiments of memory buses on which transactions take place that are synchronized to a clock signal, it will be readily understood by those skilled in the art that other embodiments may employ other forms of timing coordination or may be asynchronous.

A memory device selected via-CS0 is being controlled in a manner consistent with current day DDR protocols where a row to be accessed can be opened for access only after a different row in the same bank has first been explicitly closed via the explicit transmission of a row precharge command. At time point 381, the transmission of such an explicit precharge command occurs, possibly with the coincident transmission of the bank address of the bank of memory to which the explicit precharge command applies. A period of time is permitted to elapse between time points 381 and 383 to allow the explicitly commanded precharge operation to be completed before a row activate command to open a row to be accessed is transmitted at time point 383. In embodiments meant to conform to the timings and/or protocols of current day DDR implementations, bank and/or row addresses to which the row activate command applies may also be transmitted coincident with the transmission of the row activate command. Another period of time is permitted to elapse between time points 383 and 385 to allow the row activate operation to be completed before a read/write command is transmitted at time point 385, possibly coincident with corresponding bank and/or column addresses.

In contrast, another memory device selected via-CS1 is being controlled to carry out the same operations as was just described with regard to the memory device selected via-CS0, but without the explicit transmission of a precharge command. Specifically, at time point 387 a row activate command with an implicit precharge command is transmitted, possibly with a corresponding transmission of the bank address to which both the activate and precharge commands apply, and/or possibly with a corresponding transmission of the row address of the row to which the activate command applies. A period of time is permitted to elapse between time points 387 and 389 to allow both the implicitly command precharge operation and the explicitly commanded activate operation to be completed before a read/write command is transmitted at time point 389, possibly coincident with corresponding bank and/or column addresses.

Although the transmission of commands to each of the memory devices selected via-CS0 and -CS1 have been discussed separately, various embodiments of a memory controller (or other device employed as a memory controller) capable of transmitting commands to memory devices may incorporate support for being able to switch between using either an explicitly transmitted precharge command or an implicit precharge command accompanying a transmitted activate command. Such a memory controller may make possible the combining of memory devices supporting an implicit precharge command with other memory devices that do not. To promote interoperability with the more limited current DDR variants in which no support exists for an implicit precharge command, some embodiments of memory controller may incorporate one or more bits in one or more control registers to make possible the selective transmission of explicit precharge commands to support the more limited current DDR variants of memory devices. Furthermore, variants of memory devices that do support the use of an implicit precharge command may incorporate one or more bits in one or more control registers or other storage to provide an indication of having the ability to go beyond current DDR variants by supporting an implicit precharge command to allow the presence of such an ability to be identified.

Figure 4:
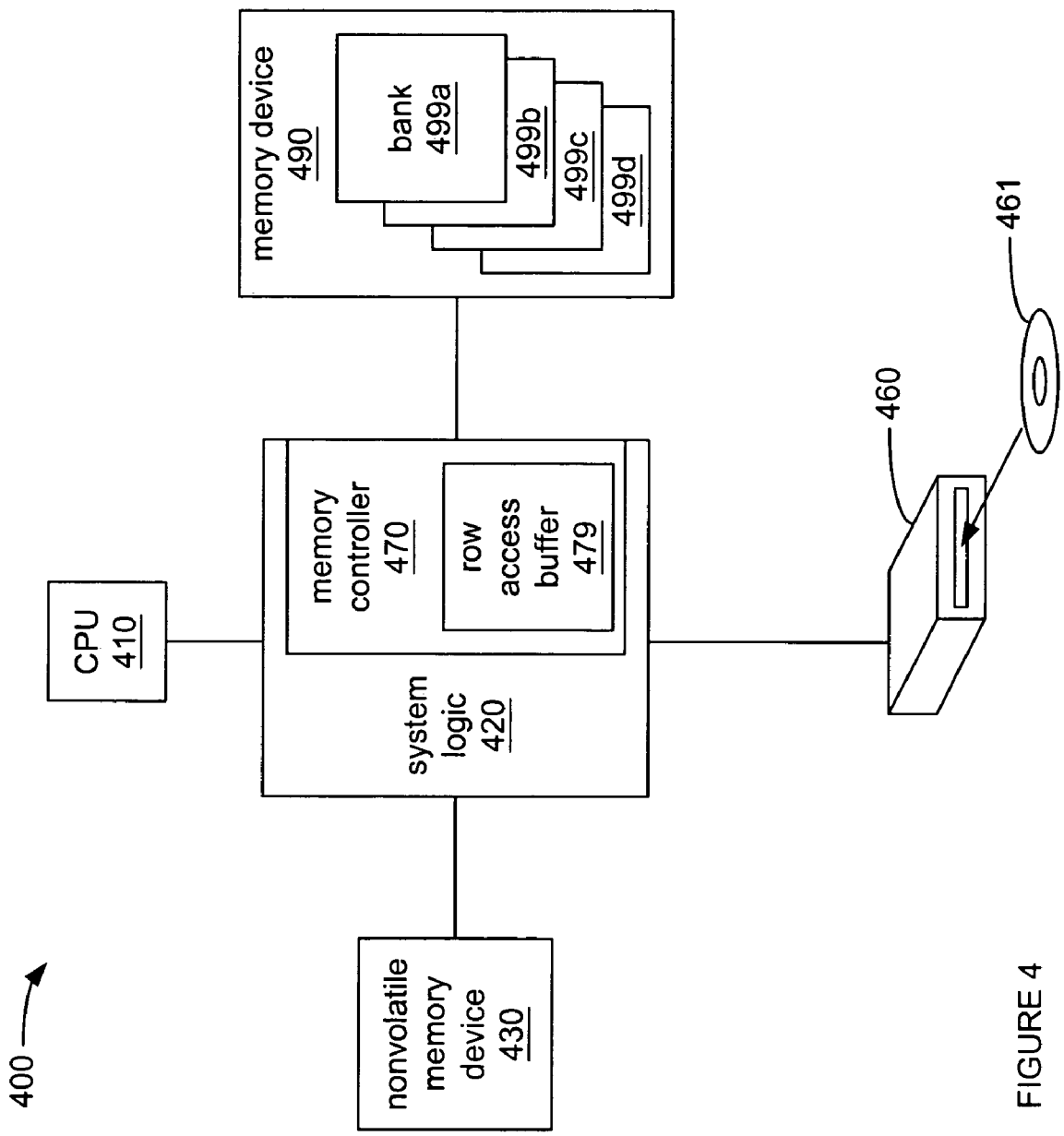
FIG. 4 is a block diagram of an embodiment employing a computer system.

FIG. 4 is a simplified block diagram of an embodiment employing a computer system. Computer system 400 is, at least in part, made up of CPU (central processing unit) 410, system logic 420, and memory device 490. System logic 420 is coupled to CPU 410 and performs various functions in support of CPU 410 including providing CPU 410 with access to memory device 490 to which system logic 420 is also coupled, using memory controller 470 within system logic 420. CPU 410, system logic 420 and memory device 490 make up a form of core for computer system 400 that is capable of supporting the execution of machine readable instructions by CPU 410 and the storage of data and instructions within memory device 490.

In various embodiments, CPU 410 could be any of a variety of types of CPU including a CPU capable of executing at least a portion of the widely known and used "x86" instruction set, and in other various embodiments, there could be more than one CPU. In various embodiments, memory device 490 could be any of a variety of types of dynamic random access memory (RAM) including fast page mode (FPM), extended data out (EDO), single data rate (SDR) or double data rate (DDR) forms of synchronous dynamic RAM (SDRAM), RAM of various technologies employing a RAMBUS™ interface, etc., and memory controller 470 provides logic 420 with an appropriate interface for the type of memory. At least a portion of the memory cells of memory device 490 are divided into banks 499*a–d*, each of which are made up of memory cells organized into rows and columns in a two dimensional memory array. To access a portion of the memory cells within memory device 490, that portion must be addressed by memory controller 470 with a combination of bank, row and column addresses. As those skilled in the art will recognize, the depiction of a single memory device 490 with four banks of memory cells, namely banks 499*a*–499*d*, is but an example of a memory system that could be a part of a computer system, and that a larger number of memory devices and/or a differing number of banks within memory devices could be used without departing from the spirit and scope of the present invention as hereinafter claimed.

In some embodiments, system logic 420 is coupled to and provides CPU 410 with access to storage device 460 by which data and/or instructions carried by storage media 461 may be accessed. Storage media 461 may be of any of a wide variety of types and technologies as those skilled in the art will understand, including CD or DVD ROM, magnetic or optical diskette, magneto-optical disk, tape, semiconductor memory, characters or perforations on paper or other material, etc. In some embodiments, nonvolatile memory device 430 is coupled to system logic 420 (or other part of computer system 400) and provides storage for an initial series of instructions executed at a time when computer system 400 is either "reset" or initialized (for example, when computer system 400 is "turned on" or "powered up") to perform tasks needed to prepare computer system 400 for normal use. In some variations of such embodiments, upon initialization or resetting of computer system 400, CPU 410 accesses nonvolatile memory device 430 to retrieve instructions to be executed to prepare memory controller 470 for normal use in providing access for CPU 410 to memory device 490. It may be that these same retrieved instructions are executed to prepare system logic 420 for normal use in providing access to storage device 460 and whatever form of storage media 461 that may be used by storage device 460.

In some embodiments, storage media 461 carries machine-accessible instructions to be executed by CPU 410 to cause CPU 410 to carry out one or more tests of memory device 490 to determine what type of DRAM device memory device 490 may be, and/or to determine what functions memory device 490 may support. If it is determined that memory device 490 is able to support the use of an implicit precharge command embedded with a transmitted row activate command, as described above, then CPU 410 may be caused to program or otherwise configure memory controller 470 to make use of such an implicit precharge command. In embodiments where memory controller 470 is so programmed, memory controller 470 may have access to or incorporate a storage device such as row access buffer 479 in which to maintain data concerning the status of various rows within memory device 490. Such data, whether stored in a specific buffer such as row access buffer 479, or not, may provide an indication of which of banks 499*a–d* have open rows, as well as the addresses of those open rows. Memory controller 470 may access such data to determine whether or not a row to be accessed in a given one of banks 499*a–d* is already open, and if not, whether or not a different row in the same bank is already open. If the row to be accessed is determined to already be open, then the access may be carried out without the transmission of a row activate command. However, if the row to be accessed is determined to not already be open, then the transmission of a row activate command and the passage of a predetermined minimum period of time will have to precede any access to be made to the row to be accessed. If it is also determined that there is a different row within the same bank that is already opened, then the row activate command will be interpreted by memory device 490 as also being an implicit precharge command to close the different row, and the predetermined minimum period of time will be longer to allow for both the closing of the different row, as well as the opening of the row to be accessed.

Figure 5:
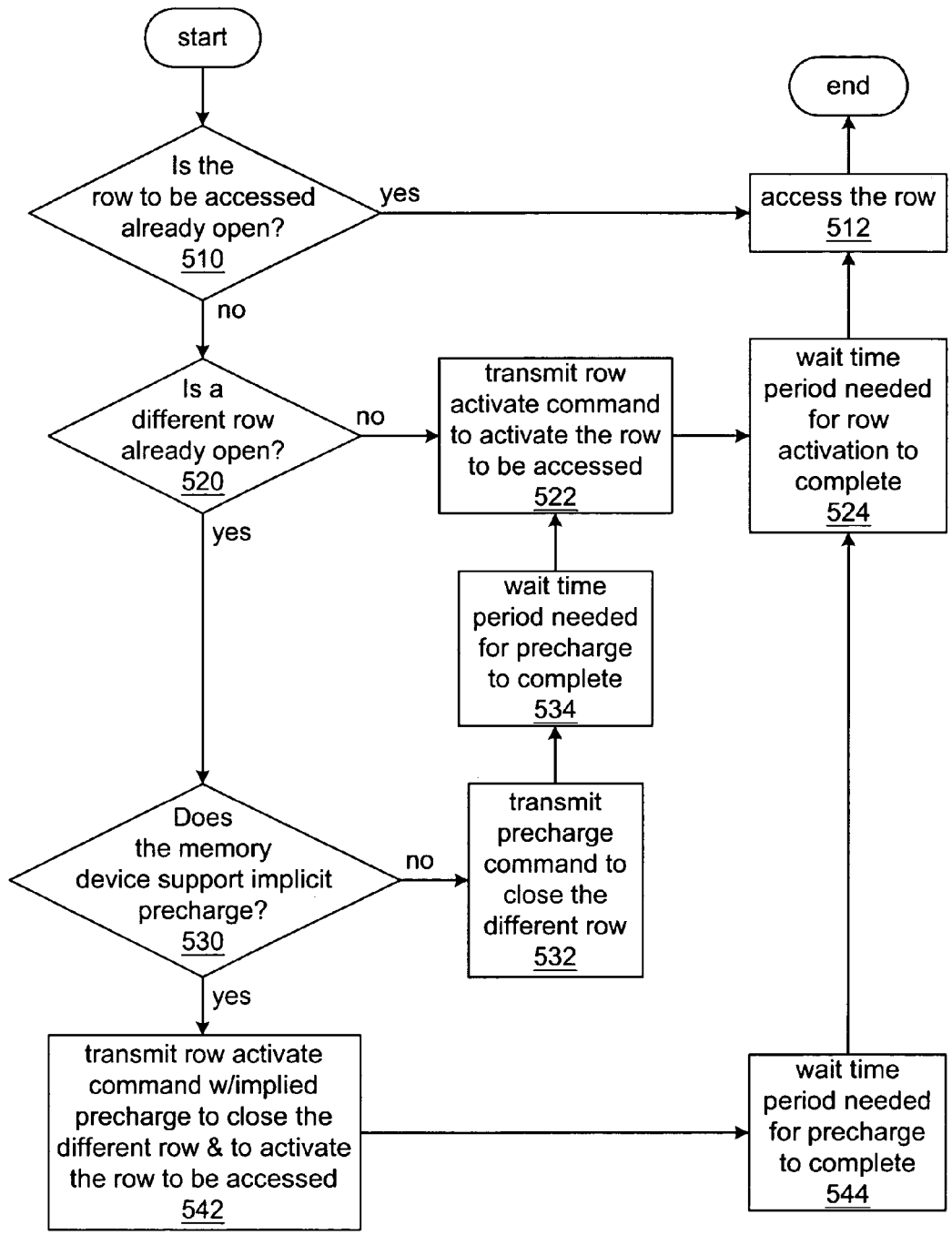
FIG. 5 is a flow chart of an embodiment.

FIG. 5 is a flow chart of embodiments. At 510, a determination is made as to whether the row to be accessed is already open. If the row to be accessed is already open, then the row is accessed for reading, writing, etc., at 512. However, if the row to be accessed is not already open, then at 520, a determination is made as to whether a different row is already open. If a different row is not already open, then a row activate command to open the row to be accessed is transmitted at 522, a period of time needed for completing activation of the row to be accessed is allowed to pass at 524, and access takes place at 512. However, if a different row is already open, then at 530, a determination is made as to whether or not the memory device having the bank in which both the different row and the row to be accessed are located supports the use of an implicit precharge command. If the memory device does support an implicit precharge command, then at 542, a row activate command with an implied precharge command is transmitted to the memory device, a period of time needed for completing the precharging (closing) of the different row is allowed to pass at 544 along with a period of time for activating the row to be accessed at 524, and access takes place at 512. However, if the memory device does not support an implicit precharge command, then at 532, an explicit precharge command to close the different row is transmitted, a period of time needed for the closing of the different row to be completed is allowed to pass at 534, the transmission of an activate command to open the row to be accessed occurs at 522 along with the passage of time sufficient to allow the activation to occur at 524, and access occurs at 512.

The invention has been described in some detail with regard to various possible embodiments. It is evident that numerous alternatives, modifications, variations and uses will be apparent to those skilled in the art in light of the foregoing description. It will be understood by those skilled in the art that the present invention may be practiced in support of many possible types of memory devices employing any of a number of possible memory technologies. It will also be understood by those skilled in the art that the present invention may be practiced in support of electronic devices other than computer systems such as audio/video entertainment devices, controller devices in vehicles, appliances controlled by electronic circuitry, etc.

What is claimed is:

1. A memory device comprising:
    at least one bank comprised of memory cells organized into a plurality of rows of memory cells; and
    control logic coupled to the at least one bank, and responsive to the receipt by the memory device of a single row activate command to open a first row such that if no rows are open when the row activate command is received then the first row within the at least one bank is opened, and that if a different row from the first row in the bank is open when the row activate command is received then the different row is closed and the first row is opened.

2. The memory device of claim 1, wherein the memory device is a dynamic random access memory, wherein the row activate command is received via a memory bus coupled to the memory device, and wherein the transfer of data across the memory bus is synchronized to a clock signal transmitted across the memory bus such that portions of data are able to be transferred with each half clock cycle.

3. The memory device of claim 1 in communication with a processor to provide an indication, that is readable by another device, of an ability of the control logic of the memory device to both open the first row and close a different row in response to receipt of the single row activate command to open the first row.

4. A controlling device comprising:
    a first storage location in which data concerning rows within a bank of memory cells within a memory device is stored; and
    control logic in communication with the first storage location to check data within the first storage location to determine if a specific row is already open within the bank, to check data within the first storage location to determine if a different row is open if the specific row is not already open, to transmit a row activate command and wait a first predetermined period of time for the row activate command to open the specific row to be carried out if the specific row is determined to not be open and no other rows are open within the bank before transmitting an access command involving that bank, and to transmit a single row activate command that further implies a precharge command and wait a second predetermined period of time for both the row activate command to open the specific row and the implied precharge command as part of the same single row activate command to close the different row to be carried out if the specific row is determined to not be open and a different is open within the bank before transmitting an access command involving that bank.

5. The controlling device of claim 4, wherein a row activate command is transmitted by the control logic to the memory device via a memory bus coupled to both the controlling device and the memory device, and wherein the transfer of data across the memory bus is synchronized to a clock signal transmitted across the memory bus such that portions of data are able to be transferred with each half clock cycle.

6. The controlling device of claim 4, further comprising a second storage location coupled to the control logic to store an indication from a memory device as to whether or not the memory device is capable of responding to the receipt of a single row activate command to open a specific row in a bank where a different row is open by carrying out a precharge operation to close the different row and carrying out a row activate operation to open the specific row.

7. The controlling device of claim 6, wherein the second storage location further stores an indication from the memory device of the length of the period of time required by the memory device to carry out the precharge operation to close the different row.

8. The controlling device of claim 6, wherein the control logic accesses the second storage location to check whether or not a given memory device is capable of responding to the receipt of a row activate command to open a specific row in a bank where a different row is open by carrying out a precharge operation to close the different row and carrying out a row activate command to open the specific row.

9. A computer system comprising:
a processor;
a memory device having at least one bank in which a plurality of memory cells are organized into rows; and
a memory controller coupled to the processor and to the memory device to transmit a row activate command to open a specific row within the at least one bank of the memory device and wait a first predetermined period of time for a row activate operation to be carried out by the memory device before transmitting a data access command to the specific row if there are no rows open within the at least one bank, and to transmit a single row activate command with an implicit precharge operation to (i)open a specific row within the at least one bank of the memory device and (ii) wait a second predetermined period of time for both the precharge operation associated with the single row activate command to close a different row and a row activate operation associated with the single row activate command to be carried out before transmitting a data access command to the specific row if a different row other than the specific row is open.

10. The computer system of claim 9, wherein the memory controller includes a plurality of buffers includes status information whether the specific row and the different row is open.

11. The computer system of claim 10, wherein the plurality of buffers within the memory controller correspond to a number of banks within the memory device.

12. The computer system of claim 9, wherein the memory controller and the memory device are coupled via a memory bus on which the transfer of data is synchronized to a clock signal transmitted across the bus, and wherein portions of data can be transferred at least on every half clock cycle.

13. A method comprising:
determining whether or not a specific row within a bank of memory cells in which a plurality of memory cells are organized into rows within a memory device is open;
determining whether or not a different row within the bank is open if the specific row is closed;
transmitting a first row activate command to the memory device to open the specific row and waiting for a first predetermined period of time for a row activate operation to be carried out by the memory device before transmitting a command for a data access operation involving the specific row to the memory device if it is determined that no rows are open within the bank; and
transmitting a second row activate command to the memory device and waiting for a second predetermined period of time for both a row activate operation to open the specific row and a precharge operation to close a different row to be carried out by the memory device before transmitting a command for a data access operation involving the specific row to the memory device if it is determined that a different row is open within the bank.

14. The method of claim 13, wherein determining whether or not the specific row within the bank of memory cells is open includes accessing a specific buffer within a memory controller that transmits the row activate command to open the specific row.

15. A method comprising:
receiving a single row activate command to open a specific row within a bank of memory cells in which a plurality of memory cells are organized into rows;
carrying out a row activate operation in response to the single row activate command to open the specific row if no rows are opened in the bank; and
carrying out both a precharge operation in response to the single row activate command to close a different row and a row activate operation to open the specific row if the specific row is closed and the different row is open.

16. The method of claim 15, further comprising providing the memory controller an indication of a memory device having the capability to respond to the transmission of a row activate command to activate a specific row within a bank by carrying out a precharge command to close a different row within the bank in addition to carrying out a row activate command to open the specific row if the specific row is closed and the different row is open.

17. A machine-accessible storage medium comprising code that when executed by a processor within an electronic device, causes the electronic device to:
check whether or not a memory device is capable of responding to a row activate command to open a specific row in a bank of memory cells having a plurality of memory cells organized into rows by carrying out both a precharge operation to close a different row and a row activate operation to open the specific row if the specific row is closed and the different row is open;
program a memory controller to transmit a single row activate command to activate a specific row in a bank when the specific row is closed and a different row is open and to wait a predetermined period of time for the memory device to carry out both a precharge command to close the different row and row activate command to open the specific row before transmitting a data access command involving the specific row to the memory device.

* * * * *